United States Patent
Lee et al.

(10) Patent No.: US 6,372,569 B1
(45) Date of Patent: Apr. 16, 2002

(54) SELECTIVE FORMATION OF HYDROGEN RICH PECVD SILICON NITRIDE FOR IMPROVED NMOS TRANSISTOR PERFORMANCE

(75) Inventors: Yong Meng Lee; Gao Feng; Yunqzang Zhang, all of Singapore (SG); Ravi Sundaresan, Plano, TX (US)

(73) Assignee: Chartered Semiconductor Manufacturing Ltd., Singapore (SG)

( * ) Notice: Subject to any disclaimer, the term of this patent is extended or adjusted under 35 U.S.C. 154(b) by 0 days.

(21) Appl. No.: 09/483,035

(22) Filed: Jan. 18, 2000

(51) Int. Cl.[7] .......................................... H01L 21/8238
(52) U.S. Cl. ...................... 438/229; 438/199; 438/223; 438/230; 438/233; 438/279
(58) Field of Search ................................ 438/199, 216, 438/223, 224, 227, 228, 229, 230, 231, 232, 233, 279, 528, 530, 542, 652, 653

(56) References Cited

U.S. PATENT DOCUMENTS

| | | | |
|---|---|---|---|
| 5,807,779 A | 9/1998 | Liaw | 438/279 |
| 5,863,820 A | 1/1999 | Huang | 438/241 |
| 5,897,372 A | 4/1999 | Howard | 438/637 |
| 5,930,627 A | 7/1999 | Zhou et al. | 438/257 |
| 6,261,891 B1 * | 7/2001 | Cheng et al. | 438/238 |
| 6,277,683 B1 * | 8/2001 | Pradeep et al. | 438/200 |

* cited by examiner

Primary Examiner—Charles Bowers
Assistant Examiner—Jack Chen
(74) Attorney, Agent, or Firm—George O. Saile; Rosemary L. S. Pike; William J. Stoffel

(57) ABSTRACT

A method of selective formation of SiN layer in a semiconductor device comprising the following steps. A semiconductor structure having at least one PMOS transistor and one NMOS transistor formed therein is provided. The PMOS and NMOS transistors each have source/drain regions, a gate, and salicide contact regions. An undoped silicate glass (USG) layer is deposited over the semiconductor structure and the PMOS and NMOS transistors. An $H_2$-rich PECVD silicon nitride layer is deposited over the undoped silicate glass layer and over the PMOS and NMOS transistors. The $H_2$-rich PECVD silicon nitride layer is patterned, etched, and removed from over the PMOS transistor. An inter-level dielectric (ILD) layer is formed over the structure. The ILD layer is densified whereby hydrogen diffuses from the $H_2$-rich PECVD silicon nitride layer overlying the NMOS transistor into the source/drain of the NMOS transistor.

27 Claims, 4 Drawing Sheets

SELECTIVE FORMATION OF HYDROGEN RICH PECVD SILICON NITRIDE FOR IMPROVED NMOS TRANSISTOR PERFORMANCE

FIELD OF THE INVENTION

The present invention relates generally to formation of NMOS and PMOS transistor semiconductor devices, and more specifically to forming SiN etch stop layers over PMOS and NMOS semiconductor devices.

BACKGROUND OF THE INVENTION

Salicide is a common process in semiconductor device manufacturing to lower the sheet resistance of polysilicon gates. Silicides are silicon-metal structures and salicides are self-aligned suicides. However, as technology improves, new processes are needed to enhance the performance of semiconductor transistors.

U.S. Pat. No. 5,897,372 to Howard describes the use of silicon-rich silicon nitride as a protective layer in a self-aligning etch.

U.S. Pat. No. 5,807,779 to Liaw describes a process for fabricating metal-oxide semiconductor field effect transistors (MOSFETs) using a local interconnect structure and silicon nitride capped, self-aligned contact openings.

U.S. Pat. No. 5,930,627 to Zhou et al. describes the use of silicon-enriched silicon oxynitride (SiON) as both an independent etch stop and as a cap layer and sidewall component over polysilicon gate electrodes in order to prevent insulator thinning and shorts caused by a misaligned contact mask.

U.S. Pat. No. 5,863,820 to Huang describes a process and structure wherein logic and memory share the same chip. A protective coating of oxide (RPO) is formed over the pedestals of the source/drain regions of the memory side allowing the salicide process to be selectively applied to the memory side. While the logic side is protected, the self-aligned contact (SAC) process is applied to the memory side.

SUMMARY OF THE INVENTION

Accordingly, it is an object of the present invention to provide a method of forming $H_2$-rich PECVD nitride films over PMOS and NMOS transistor semiconductor structures without detrimentally affecting the PMOS transistors.

Another object of the present invention is to provide a method of forming a PMOS AND NMOS semiconductor structure with improvements in NMOS transistor's margins without any detrimental impact on the PMOS transistor.

Other objects will appear hereinafter.

It has now been discovered that the above and other objects of the present invention may be accomplished in the following manner. Specifically a semiconductor structure having at least one PMOS transistor and one NMOS transistor formed therein is provided. The PMOS and NMOS transistors each have source/drain regions, a gate, and salicide contact regions. A liner is deposited over the semiconductor structure and the PMOS and NMOS transistors. An $H_2$-rich PECVD silicon nitride layer is deposited over the undoped silicate glass layer and over the PMOS and NMOS transistors. The $H_2$-rich PECVD silicon nitride layer is patterned, etched, and removed from over the PMOS transistor. An inter-level dielectric (ILD) layer is formed over the structure. The ILD layer is densified whereby hydrogen diffuses from the $H_2$-rich PECVD silicon nitride layer overlying the NMOS transistor into the source/drain of the NMOS transistor.

BRIEF DESCRIPTION OF THE DRAWINGS

The features and advantages of the method of PMOS and NMOS transistor semiconductor structures according to the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENT

Problem Solved by the Invention

With the implementation of borderless contacts, a plasma enhanced chemical vapor deposition (PECVD) nitride ($Si_xN_y$ or SiN) layer is deposited after salicide formation to act as a layer for the contact etch.

Figure 2:
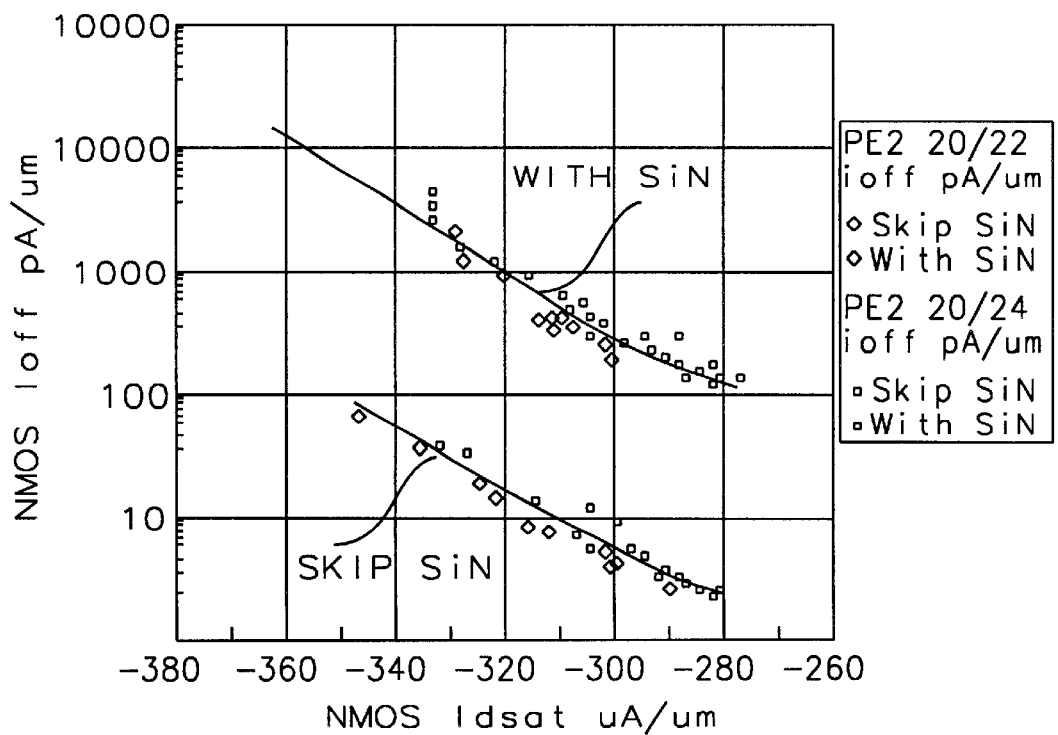
FIG. 2 is a graph plotting PMOS Ioff versus PMOS idsat for a PMOS transistor with, and without, an overlying $H_2$-rich SiN film.

However, as shown in FIG. 2, the inventors have found that with $H_2$-rich PECVD nitride films, P-channel metal oxide semiconductors (PMOS) off-state current (Ioff) leakages increase dramatically resulting in worsened PMOS transistor performance.

FIG. 2 is a graph plotting PMOS Ioff v. PMOS Idsat (drain (saturated) current) both with and without an $H_2$-rich nitride etch stop layer. As shown, the use of an $H_2$-rich PECVD nitride etch stop layer over PMOS transistors markedly increases its Ioff, thus decreasing performance.

Figure 1:
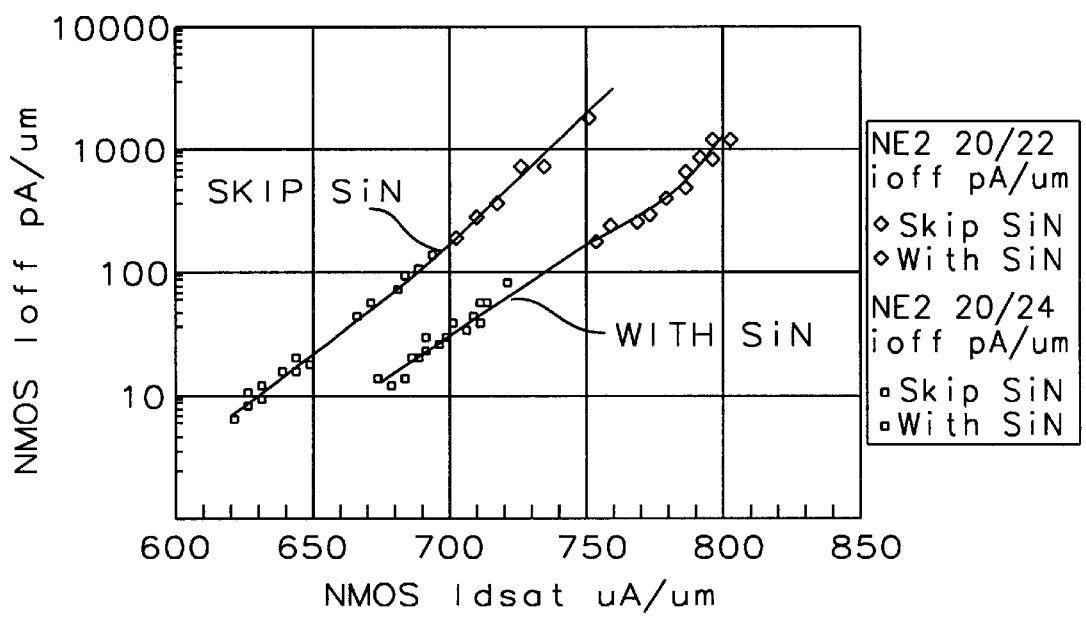
FIG. 1 is a graph plotting NMOS Ioff versus NMOS idsat for an NMOS transistor with, and without, an overlying $H_2$-rich SiN film.

But on the other hand, as shown in FIG. 1, the inventors have found that N-channel metal oxide semiconductors (NMOS) drain (saturated) current (Idsat) increases resulting from an improvement in the channel mobility with the use of $H_2$-rich PECVD nitride films.

FIG. 1 is a graph plotting NMOS Ioff v. NMOS Idsat (drain (saturated) current) both with and without an $H_2$-rich nitride etch stop layer. As shown, the use of an $H_2$-rich PECVD nitride etch stop layer over NMOS transistors markedly increases its Idsat, thus increasing performance.

With the implementation of an $H_2$-rich PECVD nitride film, the PMOS transistor leakages increases tremendously as shown in FIG. 2. Gate oxide reliability of PMOS with $H_2$-rich PECVD may also be degraded with enhanced boron penetration. Thus, even though an improvement in the NMOS transistor device performance is seen, a blanket deposition of such a film cannot be accommodated.

Preferred Embodiment of the Invention

The inventors have discovered a process of utilizing a $H_2$-rich PECVD nitride etch stop layer over a NMOS transistor semiconductor structure while realizing improvements in the NMOS transistor without any detrimental impact on the PMOS transistor.

Figure 3:
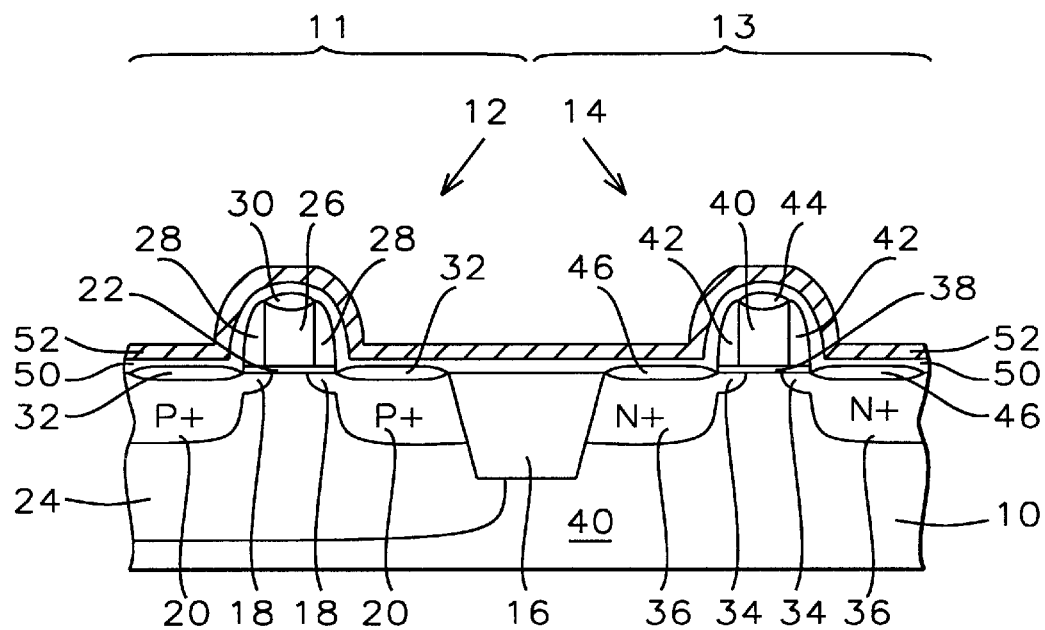
FIGS. 3 through 7 schematically illustrate in cross-sectional representation a preferred embodiment of the present invention.

Accordingly as shown in FIG. 3, starting semiconductor structure 10 includes an upper silicon layer and is understood to possibly include a semiconductor wafer or substrate, active and passive devices formed within the wafer. The term "semiconductor structure" is meant to include devices formed within a semiconductor wafer and the layers overlying the wafer. The semiconductor structure 10 can be a silicon substrate or a silicon on insulator substrate (SOI).

Unless otherwise specified, all structures, layers, etc. may be formed or accomplished by conventional methods known in the prior art.

PMOS transistor 12 and NMOS transistor 14 are formed on semiconductor structure 10 and may be separated by shallow trench isolation regions (STI) 16. PMOS transistors are formed over PMOS areas 11 in a structure 10 and NMOS transistors are formed over NMOS areas 13 in a structure.

It is noted that multiple PMOS transistors and NMOS transistors may be formed over semiconductor structure 10 and it is not necessary that the PMOS and NMOS transistors be adjacent. For purposes of example, it is expedient to illustrate PMOS transistor 12 adjacent NMOS transistor 14.

PMOS transistor 12 includes low P+ doped source and drain 18; heavily P+ doped source and drain 20; gate oxide 22; N+ well 24; gate conductor 26; gate conductor sidewall spacers 28; gate conductor silicide (salicide) contact region 30; and silicide (salicide) contact regions 32 over heavily P+ doped source and drain regions 20. The silicide gate and contact regions are preferably formed using a salicide (Self-Aligned Silicide) process.

Silicide (salicide) contact regions 30, 32 may be comprised of $TiSi_2$ or CoSi, and is preferably $TiSi_2$.

NMOS transistor 14 includes low N+ doped source and drain 34; heavily N+ doped source and drain 36; gate oxide 38; P+ substrate area 40; gate conductor 40; gate conductor sidewall spacers 42; gate conductor salicide contact region 44; and salicide contact regions 46 over heavily P+ doped source and drain regions 36.

Salicide contact regions 44, 46 may be comprised of $TiSi_2$ or CoSi, and is preferably $TiSi_2$.

After salicidation to form gate conductor salicide contact regions 30, 44 and salicide contact regions 32, 46 over PMOS and NMOS transistors 12, 14, respectively, a thin liner 50 is formed over the structure. Layer 50 maybe composed of silicon oxide, CVD oxide or TEOS oxide and most preferably Undoped Silicate Glass (USG). Any oxide layer 50 has to be deposited and not grown so as to provide blanket coverage.

Liner layer 50 is from about 135 to 165 Å thick, more preferably from about 145 to 155 Å thick, and most preferably about 150 Å thick.

$H_2$-rich PECVD silicon nitride layer 52 is then deposited over liner layer 50. $H_2$-rich PECVD nitride layer 52 is preferably from about 450 to 550 Å thick, more preferably from about 475 to 525 Å thick, and most preferably about 500 Å thick.

The PECVD deposition of $H_2$-rich PECVD nitride layer 52 is preferably conducted with a $NH_3$: $SiH_4$ ratio greater than about 1.1.

$H_2$-rich PECVD nitride layer 52 has the formula $H_x$: $Si_yN_z$ where the molar percentage of $H_x$ and $Si_yN_z$ is from about 1 to 22%, and more preferably from about 1 to 10%.

Figure 4:
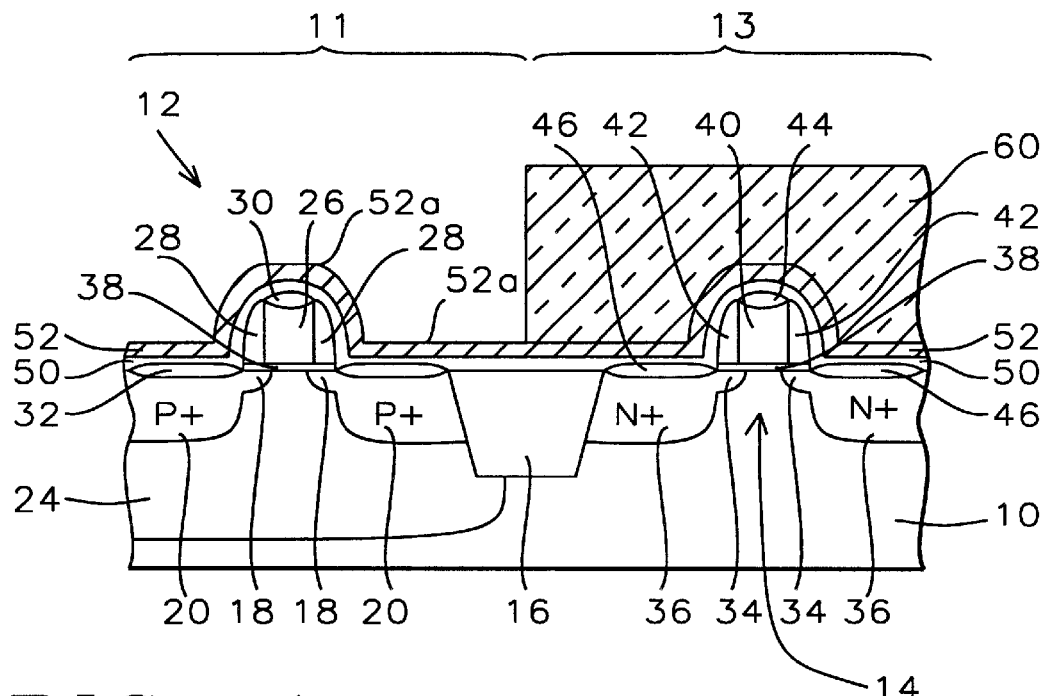

As shown in FIG. 4, P+ composite photoresist mask 60 is then formed over NMOS transistor 14 in the NMOS areas 13 approximately half way STI 16.

Figure 5:
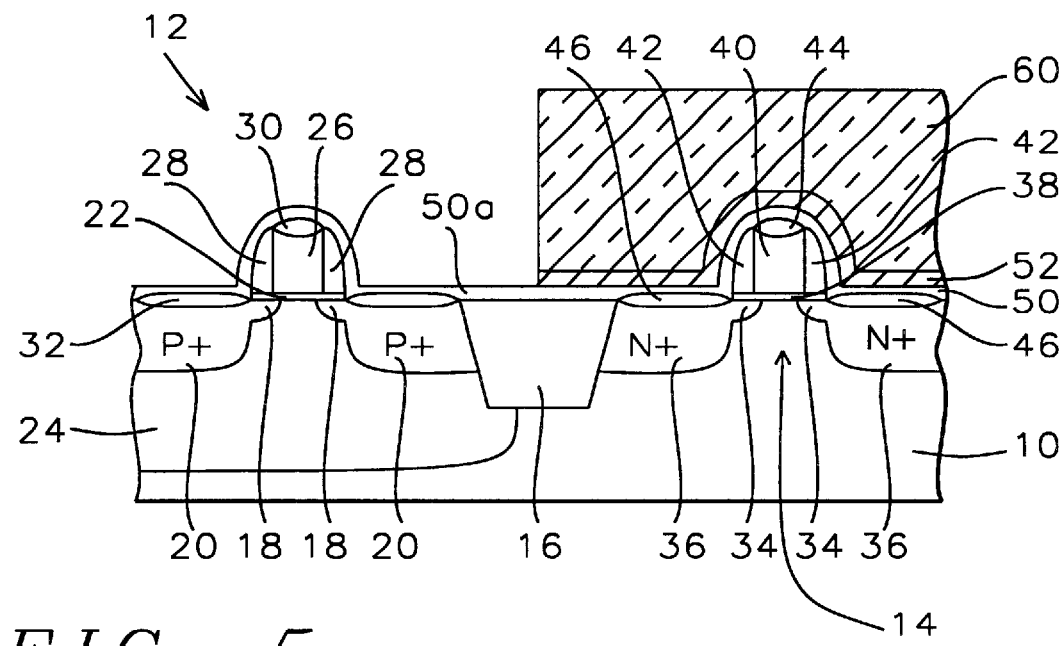

In a key step, as shown in FIG. 5, a nitride etch selective to the underlying liner layer 50, preferably an anisotropic nitride etch, is conducted to remove the unmasked $H_2$-rich PECVD nitride layer portion 52a and leave exposed liner layer portion 50a over PMOS transistor 12 and approximately half way over STI 16.

Figure 6:
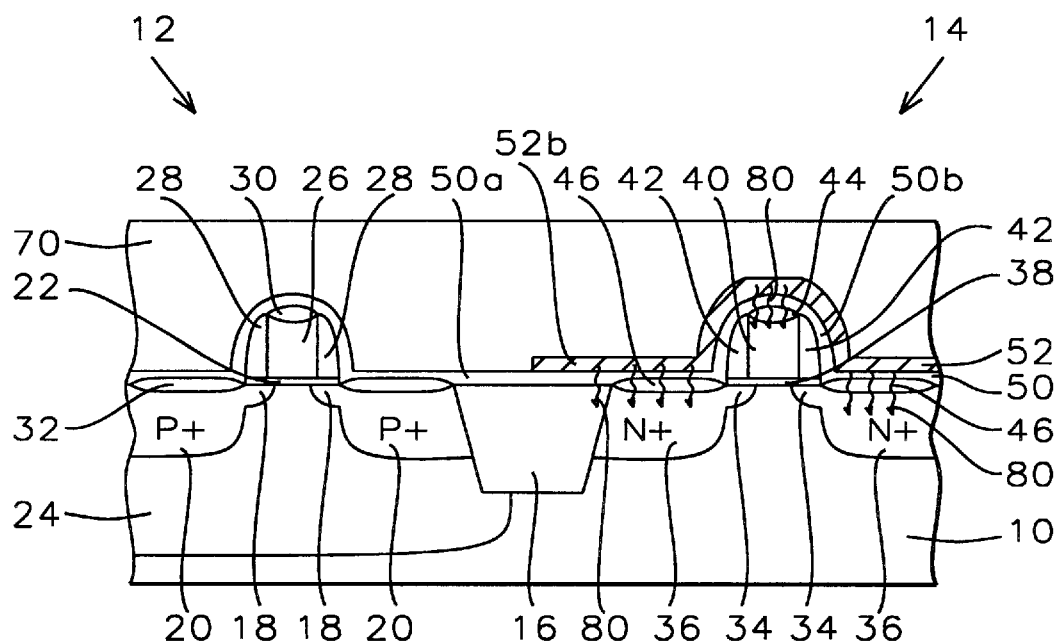

As shown in FIG. 6, P+ composite mask is stripped and removed to expose remaining $H_2$-rich PECVD nitride layer portion 52b and underlying liner layer portion 50b over NMOS transistor 14 and approximately half way over STI 16.

Inter-layer dielectric (ILD) layer 70 is then deposited and planarized, preferably by chemical-mechanical polishing (CMP), over the structure. ILD layer 70 may be comprised of PETEOS, HDP PETEOS, or SOG, and is more preferably PETEOS.

In a key step of the invention, ILD layer 70 is then densified at from about 600 to 800° C., and more preferably 700 to 800° C., for about 30 to 80 minutes, and more preferably from about 40 to 50 minutes. The purpose is this step is to drive in the hydrogen.

During this hydrogen drive-in step/densification step, the $H_2$-rich PECVD nitride layer portion 52b also acts as a solid source diffusant, providing hydrogen to NMOS transistor 14 as shown at arrows 80 into heavily N+ doped source/drain 36. As shown in FIG. 1, this decreases the Ioff (off-state current leakage) of NMOS transistor 14 resulting from an improvement in the channel mobility.

Since the process of the present invention removes the $H_2$-rich PECVD nitride layer portion 52a from over PMOS transistor 12, PMOS transistor is not deleteriously affected by any overlying $H_2$-rich PECVD nitride layer as would otherwise increase the Ioff leakages as shown in FIG. 2.

Figure 7:
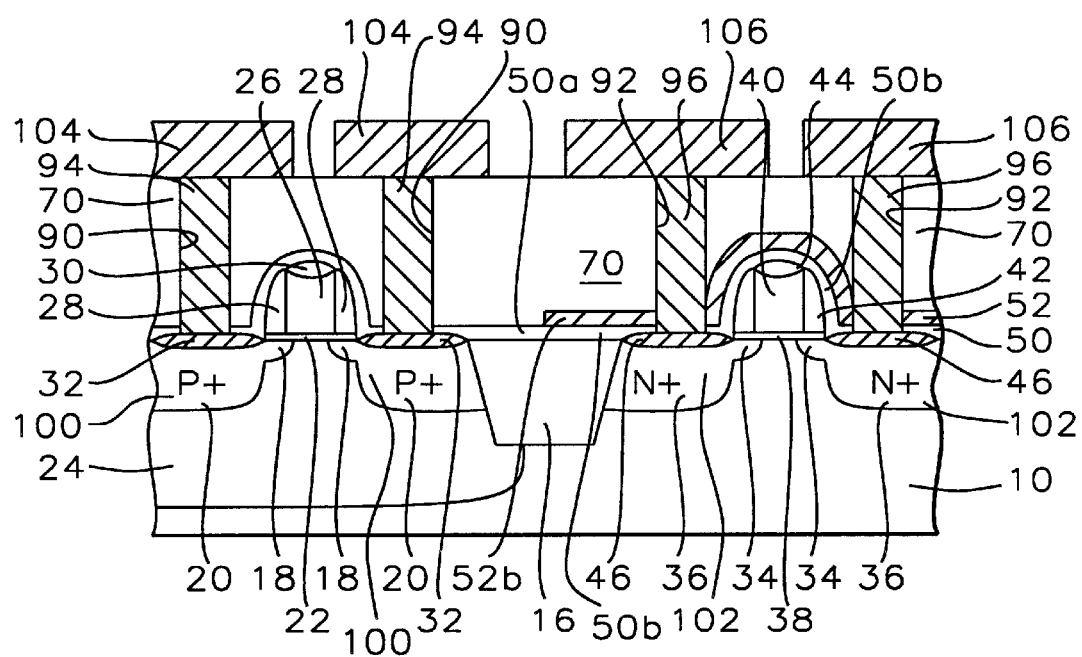

As shown in FIG. 7, ILD layer 70 is etched by a contact etch to form contact openings 90 exposing silicide regions 32 over heavily P+ doped source and drain regions 20 of PMOS transistor 12, respectively; and contact openings 92 exposing silicide regions 46 over heavily N+ doped source and drain regions 36 of PMOS transistor 14, respectively. This may be a standard two step etch, e.g. in the first step: etch oxide and nitride selective to silicide; in the second step: stop on silicide and over-etch.

The contact etch is selective to salicide contact regions 32, 46, i.e. preferably $TiSi_2$, but insensitive to $H_2$-rich PECVD nitride layer portion 52b. That is, the contact etch preferably attacks to $H_2$-rich PECVD nitride layer portion 52b while leaving $TiSi_2$ salicide contact regions 32, 46 relatively untouched. The selectively ratio between TiSi2 and to $H_2$-rich PECVD nitride for the contact etch is from about 5 to 20, and more preferably from about 10 to 20.

A layer of metal comprised of Al, W, or Cu, and is preferably tungsten, is deposited over ILD layer 70, filling contact openings 90, 92, and planarized to form metal contacts 94, 96, within contact openings 90, 92, respectively. Metal contacts 94, 96 allow electrical connection of source and drain 100, 102 of PMOS and NMOS transistors 12,14, respectively. A second layer of metal comprised of AlCu, AlSiCu, or Cu, and is preferably AlCu, is deposited over ILD layer 70 and metal contacts 94, 96 and patterned to form metal lines 104, 106 contacting metal contacts 94, 96, respectively, to complete the formation of electrically connected PMOS transistor 14 and NMOS transistor 16.

While particular embodiments of the present invention have been illustrated and described, it is not intended to limit the invention, except as defined by the following claims.

We claim:

1. A method of selective formation of SiN layer in a semiconductor device, comprising the steps of:

providing a semiconductor structure having at least one PMOS transistor and one NMOS transistor formed therein; said PMOS and NMOS transistors each having source/drain regions, a gate, and salicide contact regions over said PMOS and NMOS source/drain regions and gates;

depositing a liner layer over said semiconductor structure and said PMOS and NMOS transistors wherein said liner layer comprises an undoped silicate glass layer;

depositing an $H_2$-rich PECVD silicon nitride layer over said undoped silicate glass layer and over said PMOS and NMOS transistors;

patterning, etching and removing said $H_2$-rich PECVD silicon nitride layer over said PMOS transistor;

forming an interlevel dielectric (ILD) layer over the semiconductor structure; and densifying said interlevel dielectric layer by an anneal process;

whereby hydrogen diffuses from said $H_2$-rich PECVD silicon nitride layer overlying said NMOS transistor into said source/drain of said NMOS transistor.

2. The method of claim 1, wherein said PMOS and NMOS transistors are separated by shallow trench isolation regions.

3. The method of claim 1, wherein said liner layer is comprised of a material selected from a group comprising undoped silicate glass, silicon oxide, TEOS oxide, and CVD oxide; and said liner layer is from about 135 to 165 Å thick, said $H_2$-rich PECVD silicon nitride layer is from about 450 to 550 Å thick.

4. The method of claim 1, wherein said liner layer is comprised of a material selected from a group comprising undoped silicate glass, silicon oxide, TEOS oxide, and CVD oxide; and said liner layer from is about 145 to 155 Å thick, said $H_2$-rich PECVD silicon nitride layer is from about 475 to 525 Å thick.

5. The method of claim 1, wherein said liner layer is comprised of a material selected from a group comprising undoped silicate glass, silicon oxide, TEOS oxide, and CVD oxide; and said liner layer is about 150 Å thick, said $H_2$-rich PECVD silicon nitride layer is about 500 Å thick.

6. The method of claim 1, wherein said $H_2$-rich PECVD silicon nitride layer is formed through the use of $NH_3$:$SiH_4$ having a ratio greater than about 1.

7. The method of claim 1, wherein said etching $H_2$-rich PECVD silicon nitride layer is an anisotropic nitride etch selective to said liner layer over said PMOS transistor.

8. The method of claim 1, wherein said ILD layer densification step is conducted at a temperature from about 600 to 800° C., for about 30 to 80 minutes.

9. The method of claim 1, wherein said ILD layer densification step is conducted at a temperature from about 700 to 800° C., for about 40 to 50 minutes.

10. The method of claim 1, further including the steps of:

patterning and etching said densified ILD layer forming via openings in said ILD layer exposing said PMOS and NMOS source/drain salicide contact regions;

forming metal contacts within said via openings contacting said PMOS and NMOS source/drain salicide contact regions; and forming metal lines over said densified ILD layer and contacting said metal contacts.

11. The method of claim 1, wherein said salicide contact regions are comprised of a material selected from a group comprising $TiSi_2$ and CoSi.

12. A method of selective formation of SiN layer in a semiconductor device, comprising the steps of:

providing a semiconductor structure having at least one PMOS transistor and one NMOS transistor formed therein; said PMOS and NMOS transistors each having source/drain regions, a gate, and salicide contact regions over said PMOS and NMOS source/drain regions and gates;

depositing an undoped silicate glass (USG) layer over said semiconductor structure and said PMOS and NMOS transistors;

depositing an $H_2$-rich PECVD silicon nitride layer over said undoped silicate glass layer and over said PMOS and NMOS transistors;

patterning, etching and removing said $H_2$-rich PECVD silicon nitride layer over said PMOS transistor;

forming an inter-level dielectric (ILD) layer over the semiconductor structure;

densifying said ILD layer whereby hydrogen diffuses from said $H_2$-rich PECVD silicon nitride layer overlying said NMOS transistor into said source/drain of said NMOS transistor;

patterning and etching said densified ILD layer forming via openings in said ILD layer exposing said PMOS and NMOS source/drain salicide contact regions;

forming metal contacts within said via openings contacting said PMOS and NMOS source/drain salicide contact regions; and forming metal lines over said densified ILD layer and contacting said metal contacts.

13. The method of claim 12, wherein said PMOS and NMOS transistors are separated by shallow trench isolation regions.

14. The method of claim 12, wherein said USG layer is from about 135 to 165 Å thick, said $H_2$-rich PECVD silicon nitride layer is from about 450 to 550 Å thick.

15. The method of claim 12, wherein said USG layer is from about 145 to 155 Å thick, said $H_2$-rich PECVD silicon nitride layer is from about 475 to 525 Å thick.

16. The method of claim 12, wherein said USG layer is about 150 Å thick, said $H_2$-rich PECVD silicon nitride layer is about 500 Å thick.

17. The method of claim 12, wherein said $H_2$-rich PECVD silicon nitride layer is formed through the use of $NH_3$:$SiH_4$ having a ratio greater than about 1.

18. The method of claim 12, wherein said etching $H_2$-rich PECVD silicon nitride layer is an anisotropic nitride etch selective to said USG layer over said PMOS transistor.

19. The method of claim 12, wherein said ILD layer densification step is conducted at a temperature from about 600 to 800° C., for about 30 to 80 minutes.

20. The method of claim 12, wherein said ILD layer densification, step is conducted at a temperature from about 700 to 800° C., for about 40 to 50 minutes.

21. The method of claim 12, wherein said salicide contact regions are comprised of a material selected from a group comprising $TiSi_2$ and CoSi.

22. The method of claim 12, wherein said etching densified ILD layer is a contact etch selective to said salicide contact regions over said PMOS and NMOS source/drains.

23. The method of claim 12, wherein said metal contacts are comprised of a material selected from a group comprising tungsten, aluminum, copper, and aluminum copper alloys.

24. The method of claim 12, wherein said metal lines are comprised of a material selected from a group comprising tungsten, aluminum, copper, and aluminum copper alloys.

25. A method of selective formation of SiN layer in a semiconductor device, comprising the steps of:

providing a semiconductor structure having at least one FMOS transistor and one NMOS transistor formed therein and separated by shallow trench isolation regions; said PMOS and NMOS transistors each having source/drain regions, a gate, and $TiSi_2$ salicide contact regions over said PMOS and NMOS source/drain regions and gates;

depositing an undoped silicate glass (USG) layer over said semiconductor structure and said PMOS and NMOS transistors;

depositing an $H_2$-rich PECVD silicon nitride layer over said undoped silicate glass layer and over said PMOS and NMOS transistors;

patterning, etching and removing said $H_2$-rich PBCVD silicon nitride layer over said PMOS transistor;

forming an inter-level dielectric (ILD) layer over the semiconductor structure;

densifying said ILD layer whereby hydrogen diffuses from said $H_2$-rich PECVD silicon nitride layer overlying said NMOS transistor into said source/drain of said NMOS transistor;

patterning and etching said densified ILD layer forming via openings in said ILD layer exposing said PMOS and NMOS source/drain $TiSi_2$ salicide contact regions;

forming metal contacts within said via openings contacting said PMOS and NMOS source/drain $TiSi_2$ salicide contact regions; and forming metal lines over said densified ILD layer and contacting said metal contacts.

26. The method of claim 25, wherein said USG layer is from about 135 to 165 Å thick, said $H_2$-rich PECVD silicon nitride layer is from about 450 to 550 Å thick.

27. The method of claim 25, wherein said ILD layer densification step is conducted at a temperature from about 700 to 800° C., for about 30 to 80 minutes.

* * * * *

UNITED STATES PATENT AND TRADEMARK OFFICE
CERTIFICATE OF CORRECTION

PATENT NO. : 6,372,569 B1
DATED : April 16, 2002
INVENTOR(S) : Yong Meng Lee, Gao Feng, YunQiang Zhang and Ravi Sundaresan It is certified that error appears in the above-identified patent and that said Letters Patent is hereby corrected as shown below:

<u>Title page,</u>
Item [75], delete "Yunqzang Zhang" and replace it with -- YunQiang Zhang --.

Signed and Sealed this

Twenty-third Day of July, 2002

*Attest:*

*Attesting Officer*

JAMES E. ROGAN
*Director of the United States Patent and Trademark Office*